(12) United States Patent
Chen et al.

(10) Patent No.: US 12,477,868 B2
(45) Date of Patent: Nov. 18, 2025

(54) LIGHT-EMITTING DIODE CHIP AND LIGHT-EMITTING DIODE DEVICE

(71) Applicant: Lextar Electronics Corporation, Hsinchu (TW)

(72) Inventors: Jih-Kang Chen, Hsinchu (TW); Shiou-Yi Kuo, Hsinchu (TW); Guo-Yi Shiu, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 418 days.

(21) Appl. No.: 17/662,658

(22) Filed: May 10, 2022

(65) Prior Publication Data

US 2023/0057589 A1   Feb. 23, 2023

(30) Foreign Application Priority Data

Aug. 18, 2021   (TW) ................... 110130520

(51) Int. Cl.
| | |
|---|---|
| *H01L 33/38* | (2010.01) |
| *H01L 25/075* | (2006.01) |
| *H01L 33/10* | (2010.01) |
| *H10H 20/814* | (2025.01) |
| *H10H 20/831* | (2025.01) |

(52) U.S. Cl.
CPC ..... *H10H 20/8312* (2025.01); *H01L 25/0753* (2013.01); *H10H 20/814* (2025.01)

(58) Field of Classification Search
None
See application file for complete search history.

(56) References Cited

U.S. PATENT DOCUMENTS

| | | |
|---|---|---|
| 8,476,644 B2 | 7/2013 | Illek et al. |
| 9,236,529 B2 | 1/2016 | Kinouchi et al. |
| 9,287,464 B2 | 3/2016 | Saito et al. |
| 9,312,249 B2 | 4/2016 | Choi et al. |
| 9,899,581 B2 | 2/2018 | Choi et al. |
| 10,224,231 B2 | 3/2019 | Bower et al. |
| 10,418,535 B2 | 9/2019 | Perzlmaier et al. |

(Continued)

FOREIGN PATENT DOCUMENTS

| | | |
|---|---|---|
| CN | 112397491 A | 2/2021 |
| JP | 2009164506 A | 7/2009 |

(Continued)

*Primary Examiner* — Evren Seven
(74) *Attorney, Agent, or Firm* — CKC & Partners Co., LLC

(57) ABSTRACT

A light-emitting diode chip includes a semiconductor layer, an insulating layer, a first and a second electrode. The semiconductor layer has a top side, a bottom side opposite to the top side and a sidewall connecting the top side and the bottom side, and a concave-convex structure is at the top side of the semiconductor layer. The insulating layer covers the sidewall and the bottom side of the semiconductor layer, and has a protruding portion extending and protruding above the concave-convex structure along a direction parallel to the sidewall. A vertical distance between a highest point of the concave-convex structure and that of the protruding portion is from 0.5 μm to four times the thickness of the semiconductor layer. The first and the second electrode are on the bottom side of the semiconductor layer and penetrate through the insulating layer. The second electrode is adjacent to the first electrode.

20 Claims, 20 Drawing Sheets

(56) References Cited

U.S. PATENT DOCUMENTS

| | | | |
|---|---|---|---|
| 2014/0054594 A1* | 2/2014 | Katsuno | H10H 20/824 |
| | | | 257/98 |
| 2014/0191269 A1* | 7/2014 | Katsuno | H01L 33/20 |
| | | | 257/79 |
| 2014/0217457 A1 | 8/2014 | Cho et al. | |
| 2016/0315068 A1 | 10/2016 | Lee et al. | |
| 2018/0198045 A1* | 7/2018 | Perzlmaier | H01L 33/38 |
| 2018/0226543 A1 | 8/2018 | Masui et al. | |
| 2019/0051552 A1 | 2/2019 | Bower et al. | |
| 2020/0194624 A1* | 6/2020 | Sheng | H10H 20/013 |
| 2020/0303595 A1 | 9/2020 | Wu et al. | |
| 2022/0359786 A1* | 11/2022 | Wu | H01L 33/22 |

FOREIGN PATENT DOCUMENTS

| | | |
|---|---|---|
| TW | 201234574 A | 8/2012 |
| TW | 201923729 A | 6/2019 |
| WO | 2017/164484 A1 | 9/2017 |

\* cited by examiner

LIGHT-EMITTING DIODE CHIP AND LIGHT-EMITTING DIODE DEVICE

CROSS-REFERENCE TO RELATED APPLICATION

This application claims priority to Taiwan Application Serial Number 110130520, filed Aug. 18, 2021, which is herein incorporated by reference in its entirety.

BACKGROUND

Field of Invention

The present disclosure relates to a light-emitting diode chip and a light-emitting diode device. More particularly, the present disclosure relates to an insulating layer of the light-emitting diode chip and the light-emitting diode device.

Description of Related Art

In recent years, various novel displays have gradually become popular. These displays are mainly developed towards a direction of increasing resolution and saving energy. A micro light-emitting diode (µLED) display is one of the important types of displays in development.

Micro light-emitting diodes have reduced the size of conventional light-emitting diodes to approximately 100 microns or below, even to a magnitude of tens of microns. The number of the LEDs in the same area significantly increases at this magnitude, so the yield of the LEDs transferred from a substrate to a display substrate should reach above 99%. With techniques of recent processes, this mass transfer still faces several problems to be solved.

SUMMARY

According to some embodiments of the present disclosure, a light-emitting diode chip includes a semiconductor layer, an insulating layer, a first electrode and a second electrode. The semiconductor layer has a sidewall, a top side and a bottom side opposite to the top side. The sidewall connects the top side and the bottom side, and a concave-convex structure is at the top side of the semiconductor layer. The insulating layer covers the sidewall and the bottom side of the semiconductor layer. The insulating layer has a protruding portion extending and protruding above the concave-convex structure along a direction parallel to the sidewall, and a vertical distance between a highest point of the concave-convex structure and a highest point of the protruding portion is greater than 0.5 µm and is less than four times a thickness of the semiconductor layer. The first electrode is on the bottom side of the semiconductor layer and penetrates through the insulating layer. The second electrode is adjacent to the first electrode, and the second electrode is on the bottom side of the semiconductor layer and penetrates through the insulating layer.

According to some embodiments of the present disclosure, a thickness of the protruding portion of the insulating layer along a direction perpendicular to the sidewall is in a range from about 0.4 µm to about 3.5 µm.

According to some embodiments of the present disclosure, the highest point of the protruding portion and a center point of the concave-convex structure forms a connecting line, and the connecting line and a horizontal cross-section of the semiconductor layer forms a first angle in a range from about 1° to about 10°.

According to some embodiments of the present disclosure, an upper surface of the protruding portion of the insulating layer is flat.

According to some embodiments of the present disclosure, an upper surface of the protruding portion of the insulating layer tilts to the semiconductor layer.

According to some embodiments of the present disclosure, the upper surface and a horizontal cross-section of the semiconductor layer forms a second angle, a surface of the concave-convex structure and the horizontal cross-section of the semiconductor layer forms a third angle, and the second angle is smaller than the third angle.

According to some embodiments of the present disclosure, the protruding portion is a closed ring and is set along a perimeter of the semiconductor layer to surround the semiconductor layer.

According to some embodiments of the present disclosure, the protruding portion is a non-closed ring comprising at least an opening and is set along a perimeter of the semiconductor layer to surround the semiconductor layer.

According to some embodiments of the present disclosure, the protruding portion includes at least a pair of sub-protruding portions, and the at least a pair of sub-protruding portions are point symmetrically centered at a geometric center of the semiconductor layer and are set at a perimeter of the semiconductor layer.

According to some embodiments of the present disclosure, the insulating layer is able to deflect light emitting from the semiconductor layer.

According to some embodiments of the present disclosure, the insulating layer comprises a distributed Bragg reflector (DBR).

According to some embodiments of the present disclosure, a material of the insulating layer comprises an oxide layer, a nitride layer, or combinations thereof.

According to some embodiments of the present disclosure, a light-emitting diode device includes a carrier and a plurality of the light-emitting diode chips arranged on the carrier.

The protruding portion of the insulating layer in the present disclosure can reduce the contact area between the light-emitting diode chip and the adhesive material, thereby reducing adhesion between the light-emitting diode chip and the adhesive material. Therefore, when transferring the light-emitting diode chip, the light-emitting diode chip will not be unable to entirely detached from the adhesive material due to excessively huge adhesion between the light-emitting diode chip and the adhesive material, such that the yield of transferring the light-emitting diode chip may be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
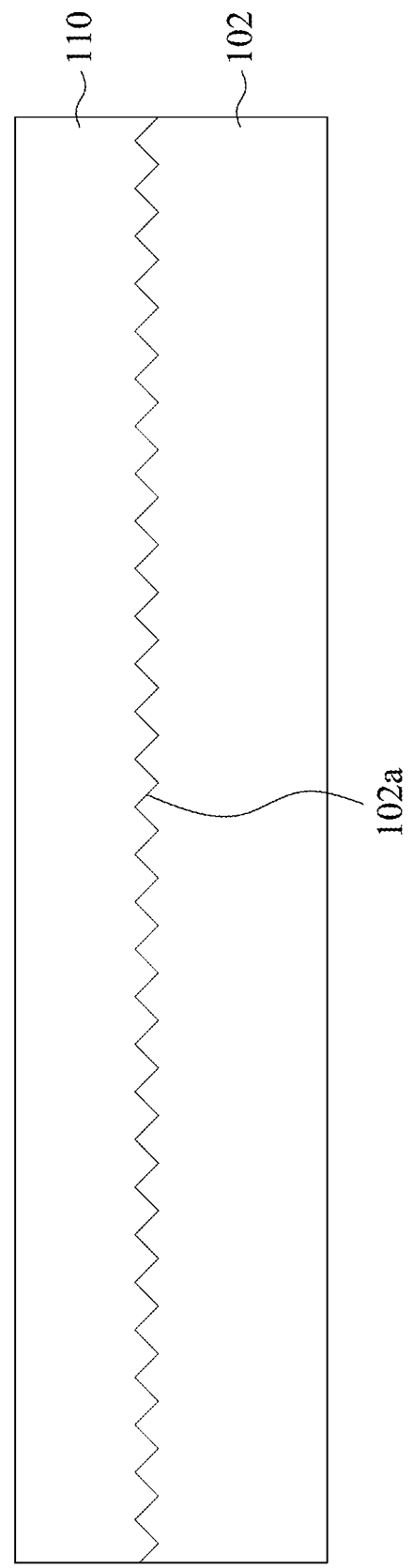
FIGS. 1A, 1B, 2, 3, 4, 5, 6, 7, 8, 9, 10, 11, 12, 13, and 14 illustrate a manufacturing process of a light-emitting diode device including light-emitting diode chips.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Some embodiments of the present disclosure can enhance yield of transferring light-emitting diodes. Specifically, an insulating layer of a light-emitting diode in some embodiments of the present disclosure has a protruding portion protruding above a semiconductor layer. Hence, when transferring light-emitting diodes by using a carrier including an adhesive material, the light-emitting diodes may insert into the adhesive material with the protruding portion, thereby reducing contact area between the light-emitting diode and the adhesive material. Adhesion between the light-emitting diode and the adhesive material is at a moderate level accordingly. Therefore, the light-emitting diode is well detached from the adhesive material during transfer, thereby enhancing yield of transferring the light-emitting diode chip.

Figure 1B:
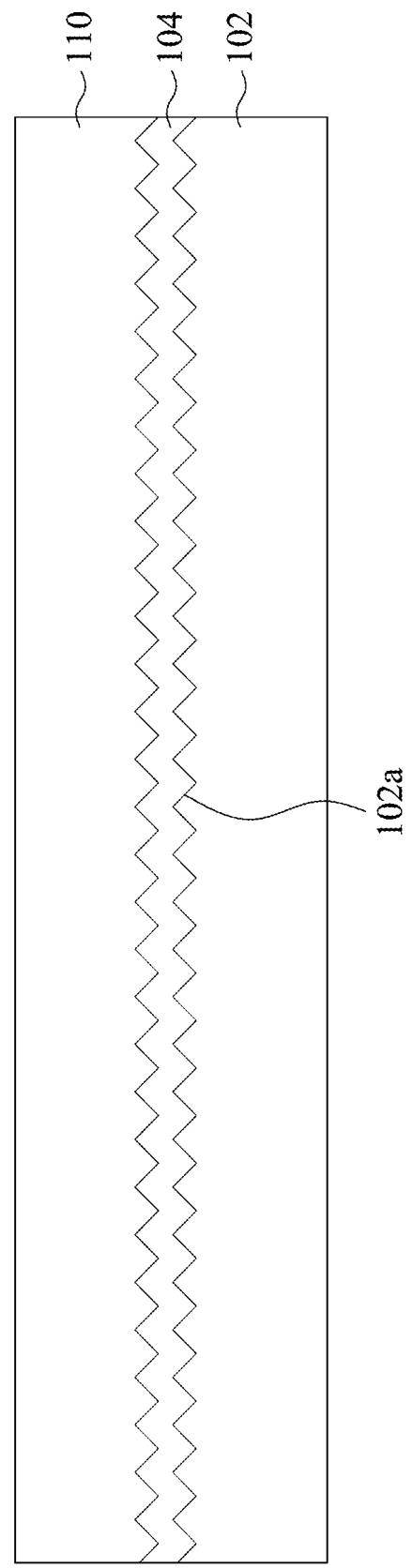

FIGS. 1A-14 illustrate a manufacturing process of a light-emitting diode device 200 including light-emitting diode chips 100. Referring to FIG. 1A, a semiconductor layer 110 is formed on a wafer 102. An upper surface 102a of the wafer 102 is a concave-convex surface, so a concave-convex interface is formed between the semiconductor layer 110 and the wafer 102 when forming the semiconductor layer 110 on the wafer 102. In some embodiments, a conformal polymer layer 104 is additionally formed between the semiconductor layer 110 and the wafer 102, as shown in FIG. 1B. Therefore, a concave-convex interface may also be formed between the polymer layer 104 and the wafer 102.

In some embodiments, the wafer 102 may include semiconductor, silicon, sapphire, or the like. In some embodiments, the semiconductor layer 110 may at least include a first semiconductor layer, an active layer and a second semiconductor layer (may correspond to the first semiconductor layer 114, the active layer 116 and the second semiconductor layer 118 in FIG. 15). In some embodiments, the first semiconductor layer may be n-doped GaN, the active layer may be GaN added with quantum well structures and/or quantum dot structures, and the second semiconductor layer may be p-doped GaN. The semiconductor layer 110 may also be made of other materials.

Figure 2:
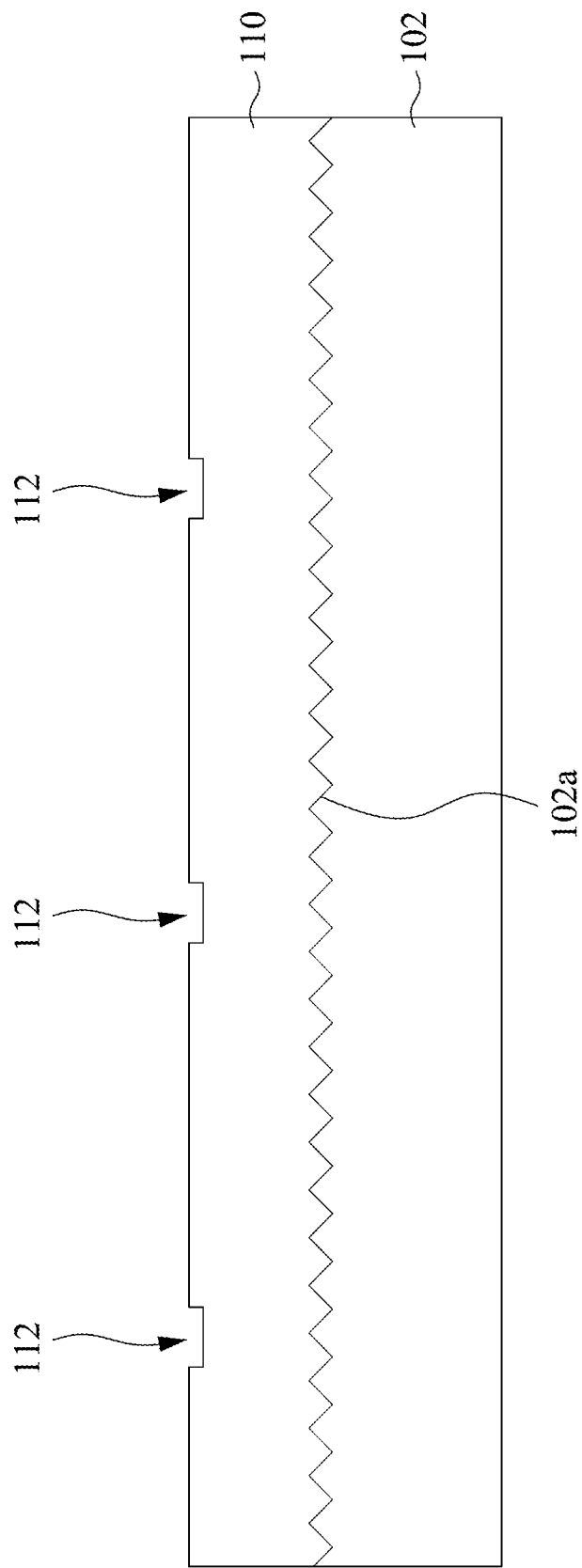

Referring to FIG. 2, an etching process is performed to etch the semiconductor layer 110 to form recesses 112 in the semiconductor layer 110. In some embodiments, a suitable etching process, such as dry etching or wet etching, may be performed to form the recesses 112. The recesses 112 define locations of subsequently formed electrodes (such as the first electrode 131 in FIG. 5).

Figure 3:
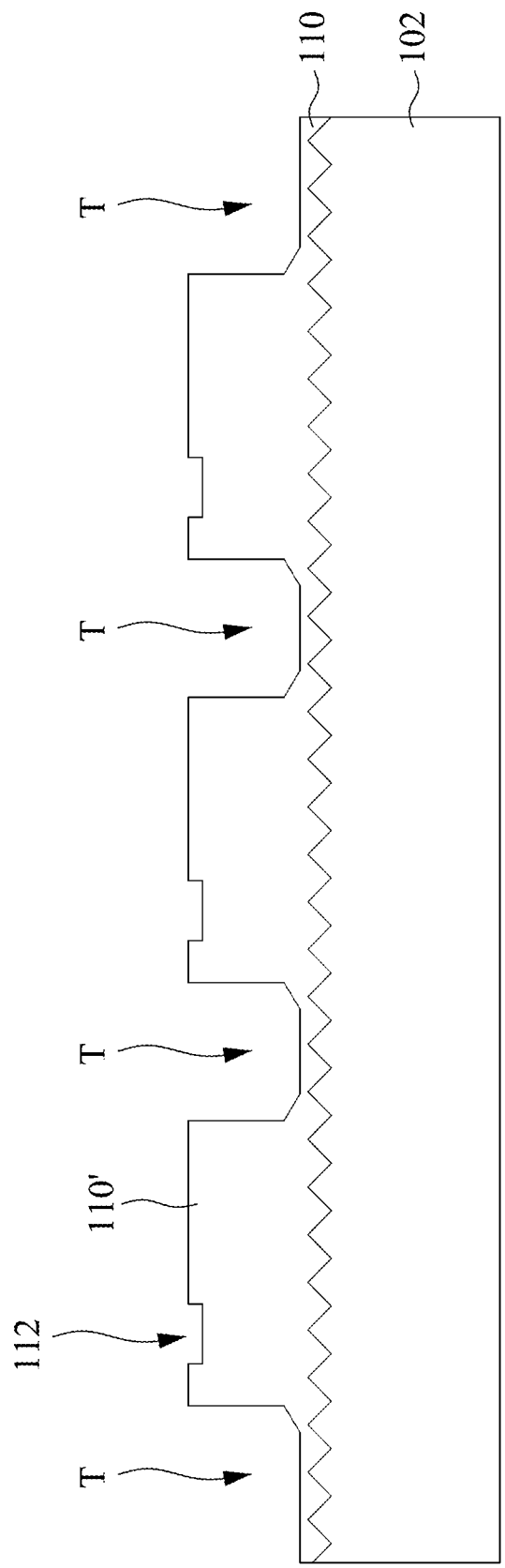

Referring to FIG. 3, the semiconductor layer 110 is further partially etched to form a plurality of trenches T in the semiconductor layer 110. Adjacent trenches T define a patterned semiconductor layer 110' and a sidewall (such as the sidewall 111a in FIG. 15) of a subsequently formed light-emitting diode chip (such as light-emitting diode chip 100 in FIG. 15). In FIG. 3, the semiconductor layer 110 is only partially etched, i.e. a bottom of the semiconductor layer 110 is still connected, and the etching process in FIG. 3 does not etch the wafer 102.

Figure 4:
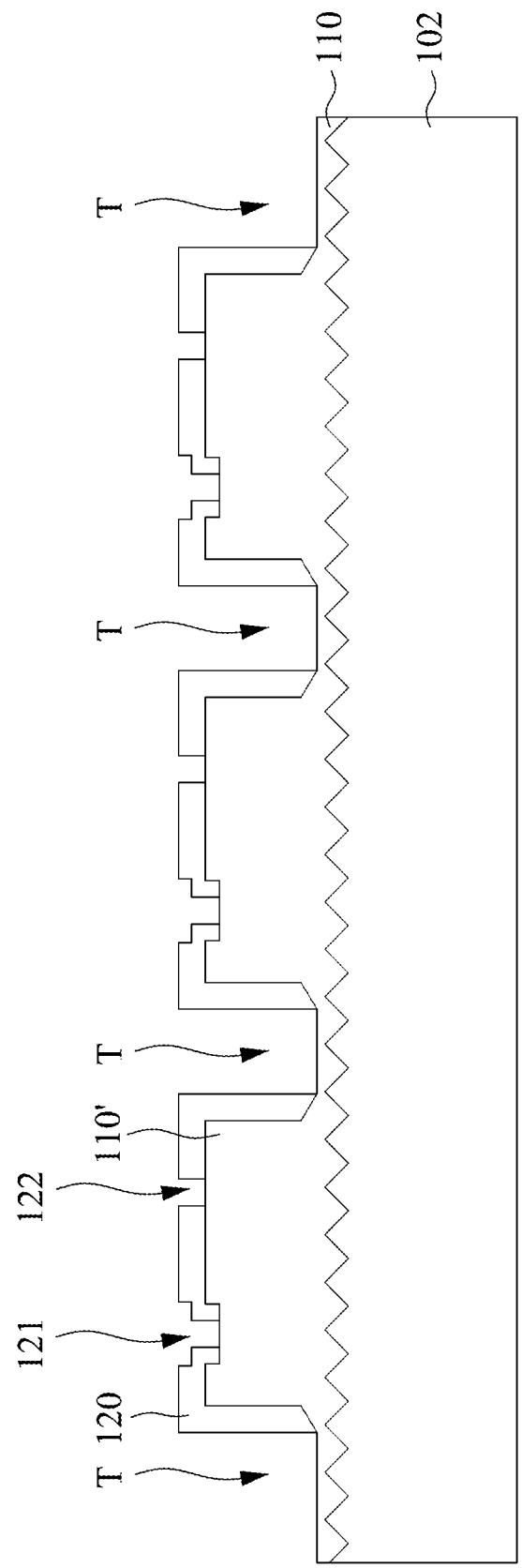

Referring to FIG. 4, after etching the semiconductor layer 110, insulating layers 120 are conformally formed over the semiconductor layer 110, and first electrode holes 121 and second electrode holes 122 are formed in the insulating layers 120. The first electrode hole 121 is over the recess 112. Therefore, the location of the first electrode hole 121 is lower than the second electrode hole 122. In some embodiments, the first electrode hole 121 exposes the first semiconductor layer (such as the first semiconductor layer 114 in FIG. 15) and the second electrode hole 122 exposes the second semiconductor layer (such as the second semiconductor layer 118 in FIG. 15). In some embodiments, the insulating layers 120 include an oxide layer, a nitride layer, or combinations thereof.

Figure 5:
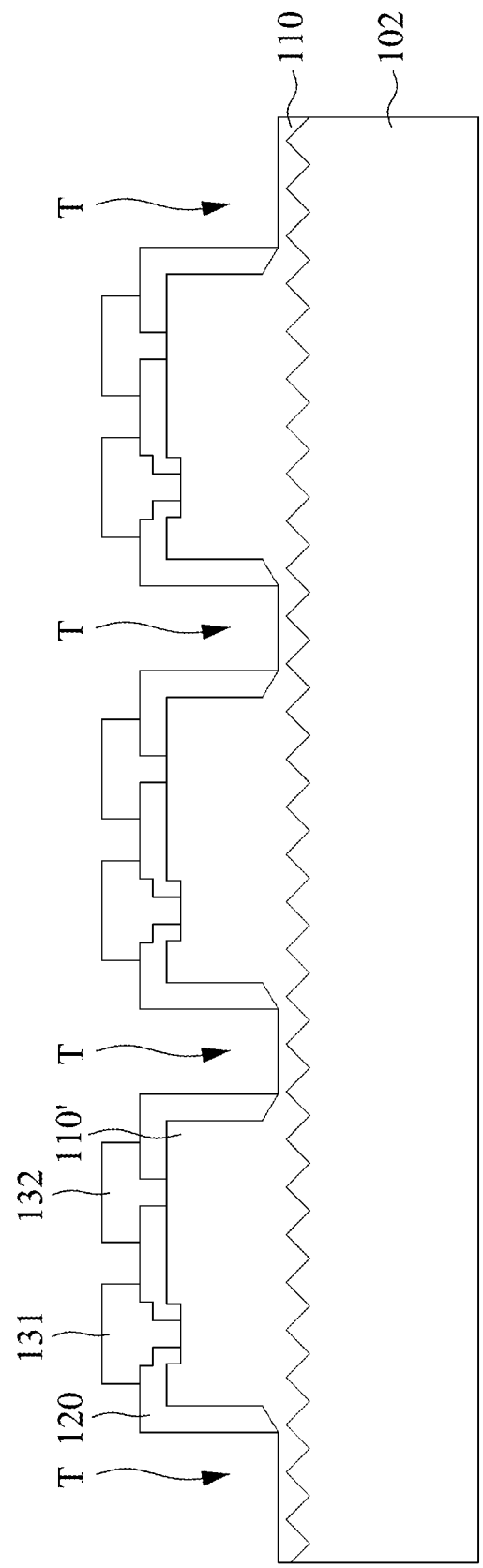

Referring to FIG. 5, first electrodes 131 and second electrodes 132 are formed in the first electrode holes 121 and the second electrode holes 122. Any suitable conductive materials, such as metal, may be used to form the first electrodes 131 and the second electrodes 132. The first electrode 131 and the second electrode 132 connect with different locations in the patterned semiconductor layer 110', such as different types of the semiconductor layers in the patterned semiconductor layer 110' (which will be described in FIG. 15 in detail).

Figure 6:
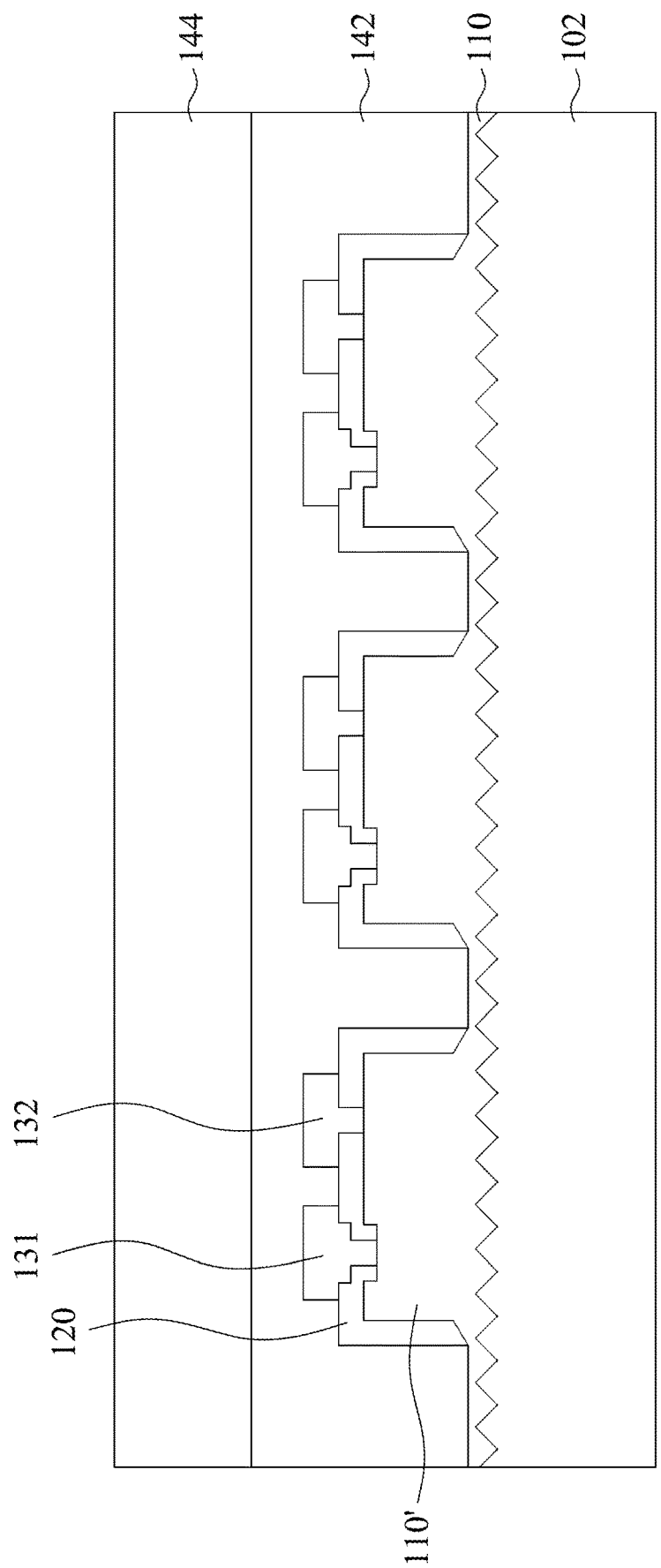
Figure 7:
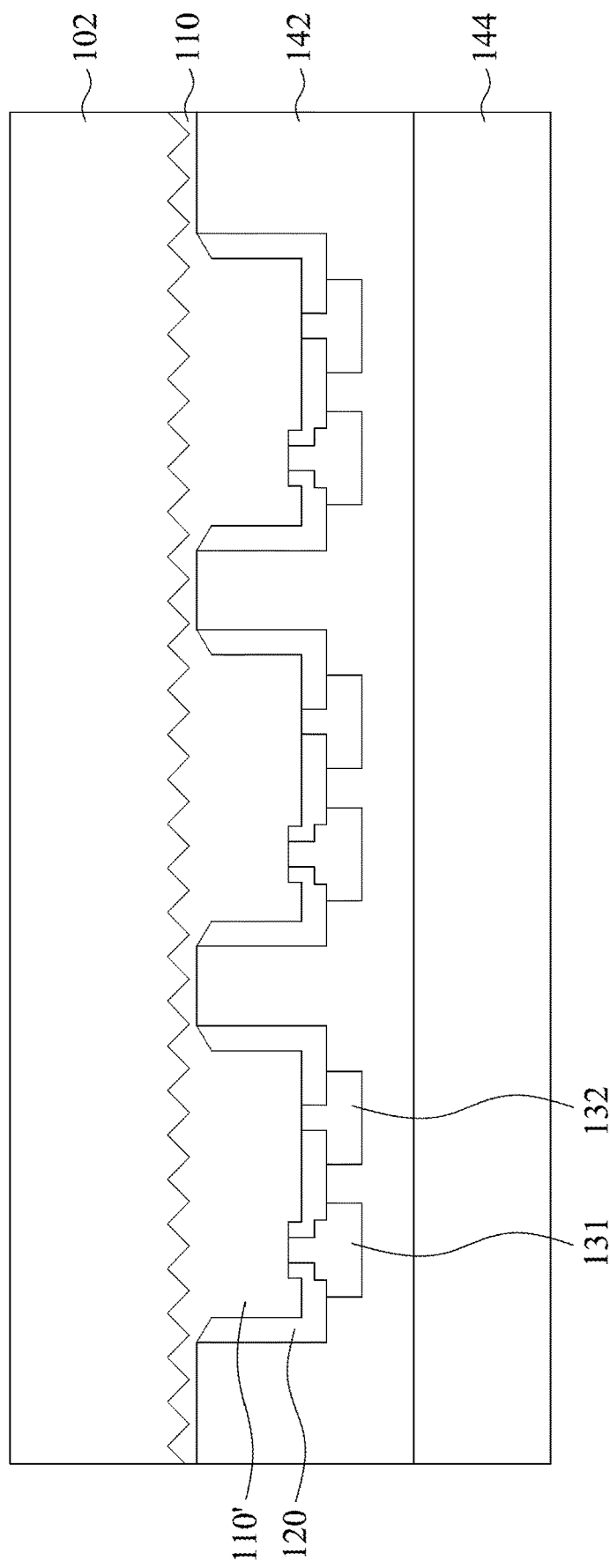

Referring to FIG. 6, a sacrificial layer 142 and a first carrier 144 are sequentially formed over the structure shown in FIG. 5. The sacrificial layer 142 may be any suitable dielectric material, and the material has an etching selectivity compared to the insulating layers 120. The first carrier 144 may be made of the material similar to or the same as the material of the wafer 102. In FIG. 7, the structure in FIG. 6 is then flipped, such that the first carrier 144 is at the bottom of the entire structure.

Figure 8:
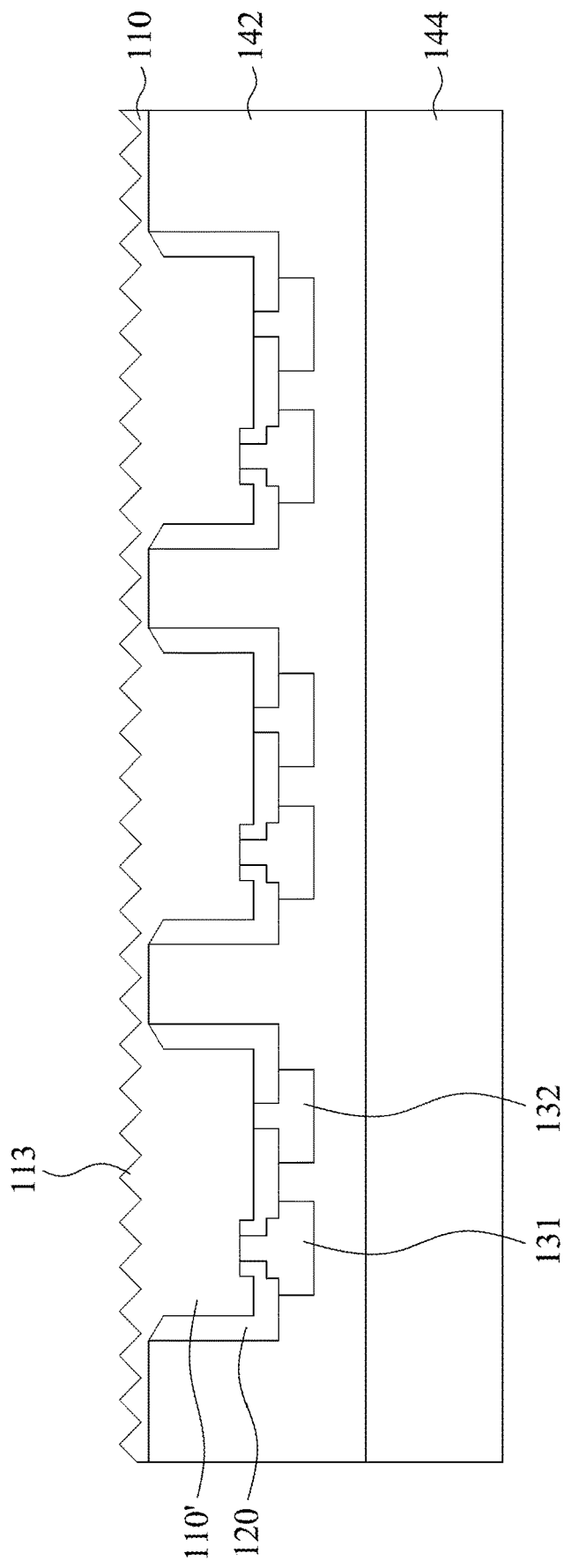

Referring to FIG. 8, the wafer 102 is removed. The wafer 102 may be removed by an etching process, a laser-lift-off process, or other suitable methods. Because a concave-convex interface is between the patterned semiconductor layer 110' and the wafer 102, after removing the wafer 102, the patterned semiconductor layer 110' has a concave-convex structure 113. When the subsequently formed light-emitting diode chip (such as the light-emitting diode chip 100 in FIG. 15) has a concave-convex structure 113, total reflection of light may be reduced, thereby increasing light extraction efficiency.

Figure 9:
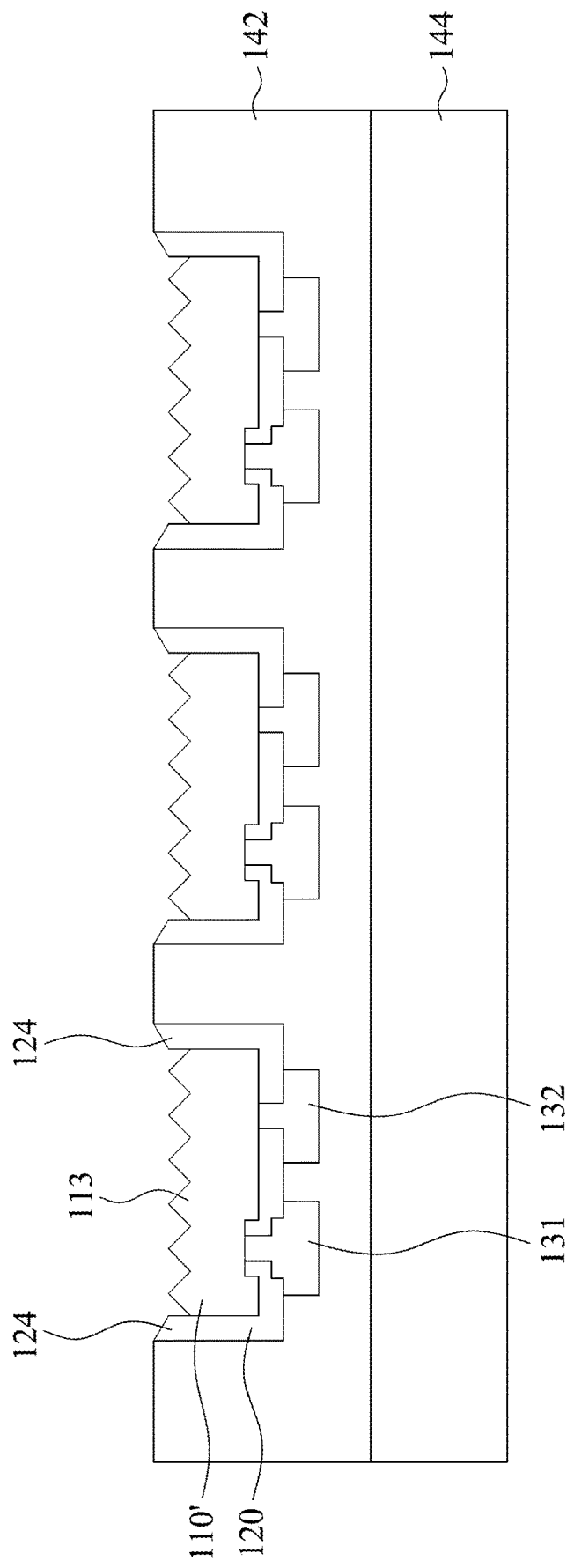

Referring to FIG. 9, the patterned semiconductor layers 110' are partially removed, such that the heights of the patterned semiconductor layers 110' are lower than the heights of the insulating layers 120 and protruding portions 124 of the insulating layers 120 are formed. The protruding portions 124 of the insulating layers 120 protrude above the concave-convex structures 113 of the patterned semiconductor layers 110' and are used to enhance yield of chip transfer in a subsequent transfer process. Any suitable etching method may be used to remove a portion of the patterned semiconductor layers 110'. The removal process in FIG. 9 removes the portion of the patterned semiconductor layers 110' downwardly at the substantially same rate; therefore the patterned semiconductor layers 110' still have the concave-convex structures 113 after the removal process. After or during removing the portion of the patterned semiconductor layers 110', the protruding portions 124 of the insulating layers 120 may be patterned, such that the protruding portions 124 of the insulating layers 120 have different plan-view patterns.

Figure 19:
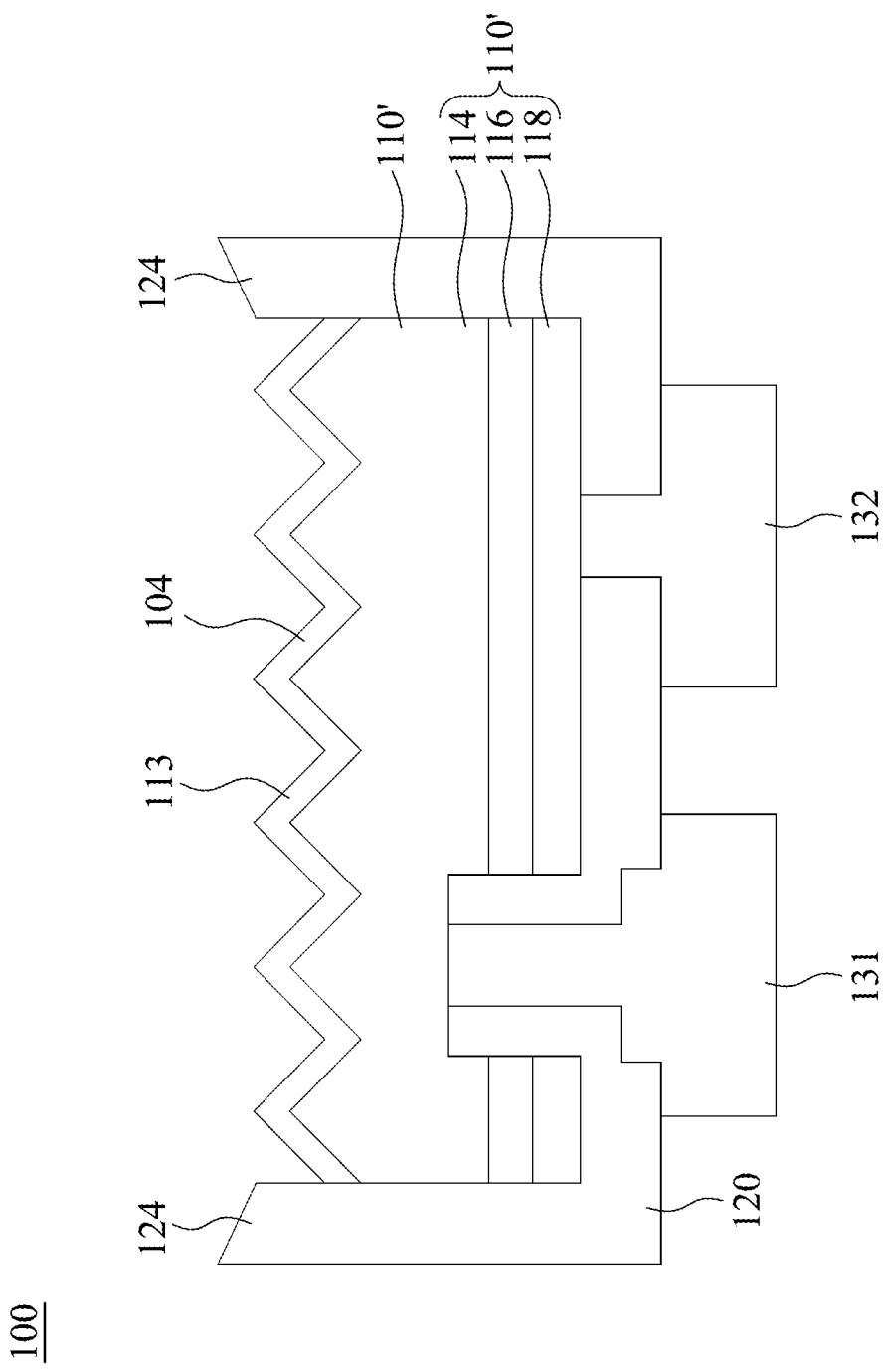
FIG. 19 illustrates a cross-section view of the light-emitting diode chip of some embodiments in accordance with the present disclosure.

In some embodiments where polymer layers are on the patterned semiconductor layers 110' (such as the embodiment developed from FIG. 1B), the polymer layers 104 (FIG. 1B) are partially removed, such that the protruding portions 124 of the insulating layers 120 protrude above the concave-convex structures 113 of the patterned semiconductor layers 110'. Therefore, in this embodiment, the concave-convex structures 113 may also include the polymer layers 104 (FIG. 19).

Figure 10:
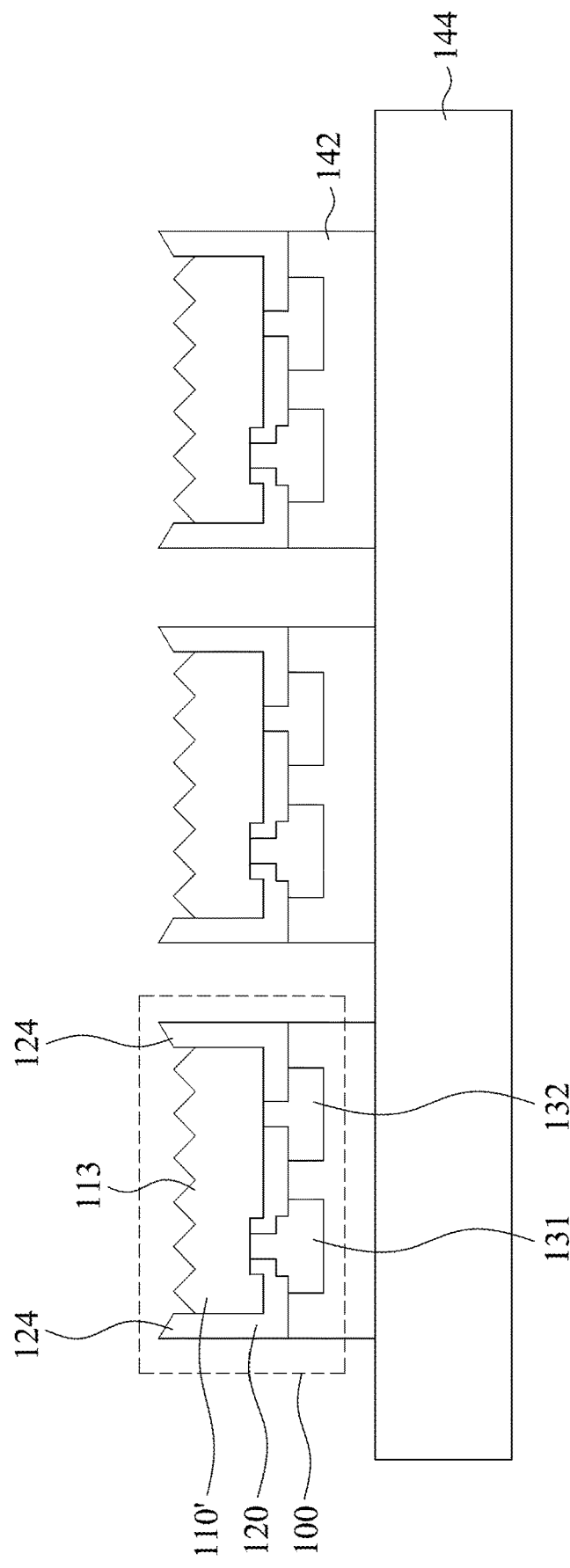
Figure 11:
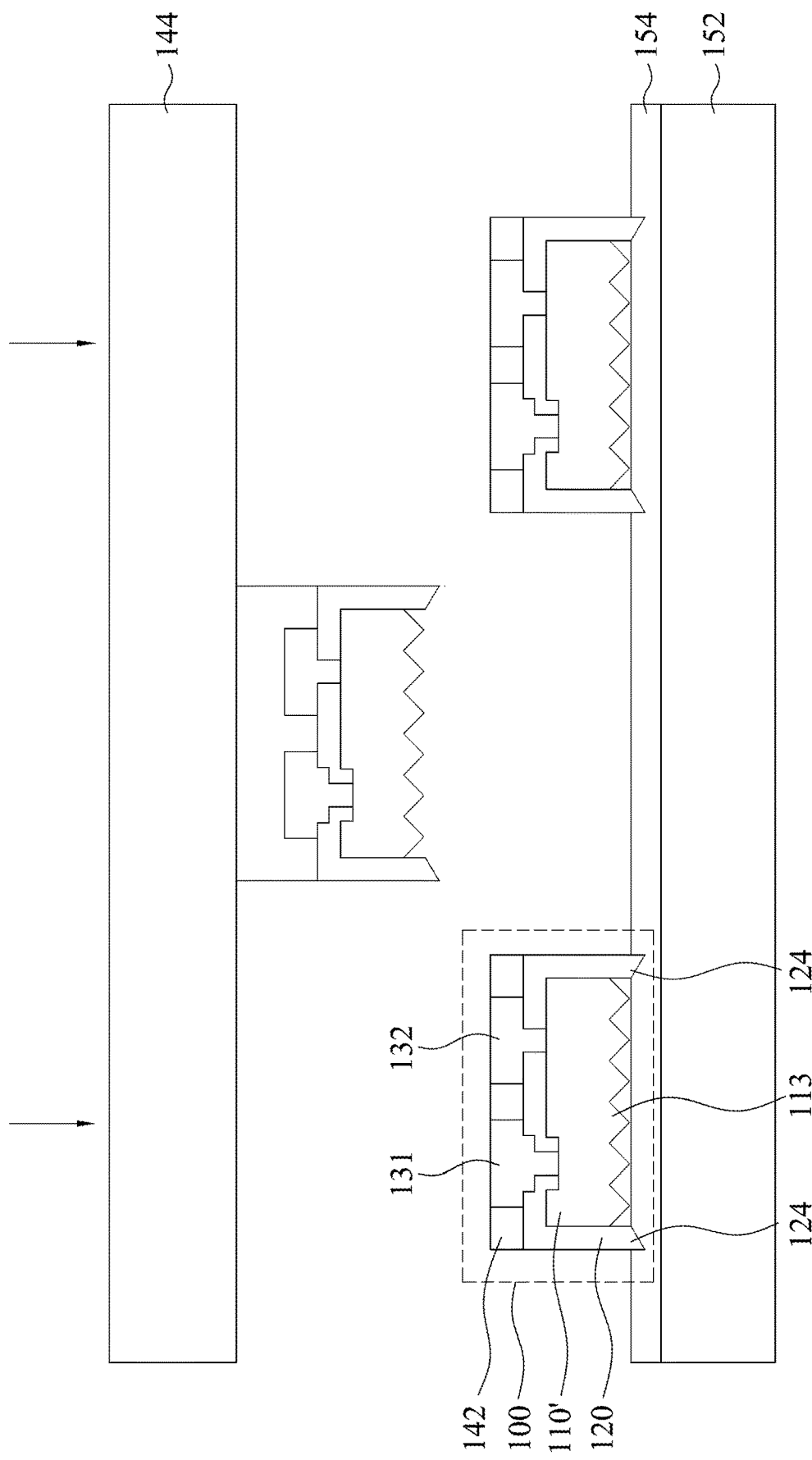
Figure 12:
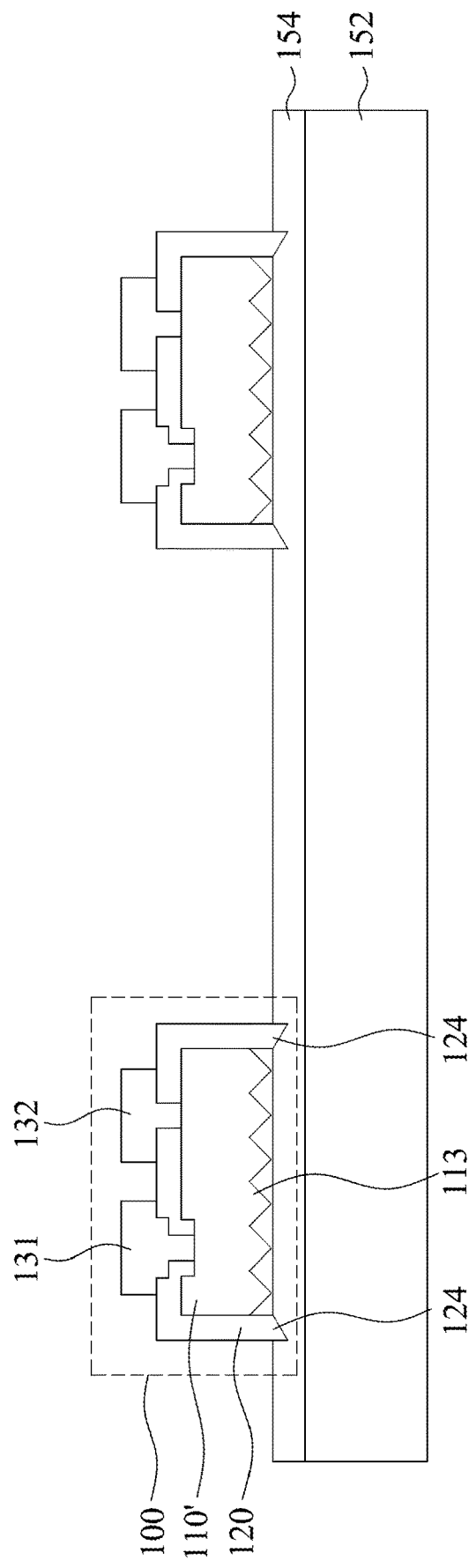

Referring to FIG. 10, a portion of the sacrificial layer 142 is removed. Specifically, the sacrificial layer 142 is vertically (anisotropically) removed along outer surfaces of the insulating layers 120, and independent light-emitting diode chips 100 are formed. Subsequently, referring to FIG. 11, after flipping over the structure in FIG. 10 again, the light-emitting diode chips 100 on the first carrier 144 are transferred to a second carrier 152. The second carrier 152 is coated with an adhesive material 154. During the transfer of the light-emitting diode chips 100, the protruding portions 124 of the insulating layers 120 easily insert into the adhesive material 154 and the light-emitting diode chips 100 are fixed on the adhesive material 154. Because the protruding portions 124 are higher than top sides of the patterned semiconductor layers 110', the top sides of the patterned semiconductor layers 110' may not be in contact with the adhesive material 154 or only be partially in contact with the adhesive material 154. Either way, adhesion between the top sides of the patterned semiconductor layers 110' and the adhesive material 154 is reduced due to reduction in contact area. And the light-emitting diode chips 100 are mainly fixed on the adhesive material 154 by the protruding portions 124. In addition, the transfer process may selectively dispose some of the light-emitting diode chips 100 on the adhesive material 154 for different requirements. For example, as shown in FIG. 11, this transfer process disposes some of the light-emitting diode chips 100 on the adhesive material 154, and the other light-emitting diode chips 100 still remain on the first carrier 144. Subsequently, the remaining sacrificial layers 142 at the transferred light-emitting chips are removed, as shown in FIG. 12.

Figure 13:
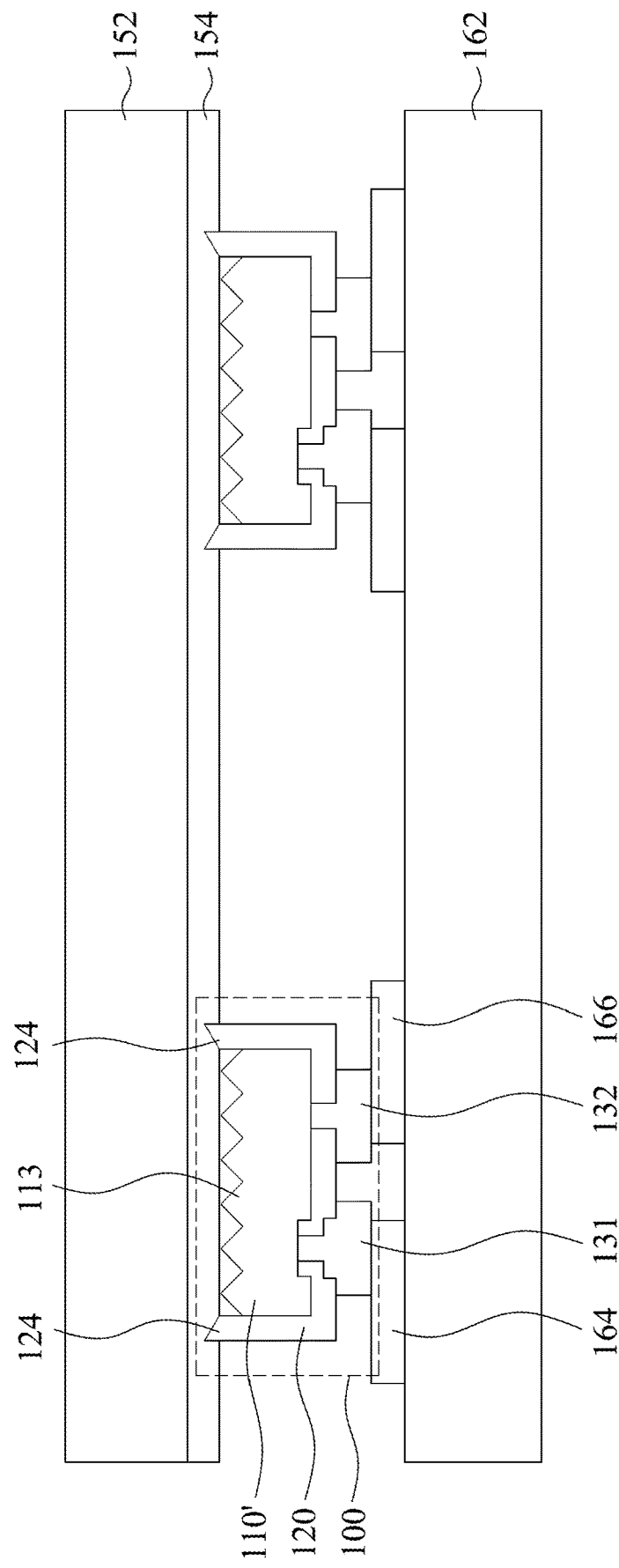

Referring to FIG. 13, the second carrier 152 is flipped over, and the light-emitting diode chips 100 on the second carrier 152 are transferred to a third carrier 162. In some embodiments, the third carrier 162 is a circuit board, and conductive pads 164 and 166 are disposed on the third carrier 162. When transferring the light-emitting diode chips 100, conductive pads 164 and 166 are in contact with the first electrode 131 and the second electrode 132 respectively to electrically connect with the first electrode 131 and the second electrode 132 respectively. As such, because the protruding portions 124 of the insulating layers 120 protrude above the patterned semiconductor layers 110', the contact area between the patterned semiconductor layer 110' and the adhesive material 154 is reduced when the protruding portion 124 of the insulating layer 120 inserts into the adhesive material 154 on the second carrier 152. Adhesion between the patterned semiconductor layer 110' and the adhesive material 154 is also smaller. When transferring the light-emitting diode chips 100 to the third carrier 162, smaller adhesion makes the patterned semiconductor layers 110' easily detached from the adhesive material 154 and then transfer to the third carrier 162 without damaging the patterned semiconductor layers 110' of the light-emitting diode chips 100. The light-emitting diode chips 100 transferring to the third carrier 162 are arranged on the third carrier 162 and may be used for a light-emitting diode device 200 in a subsequent application, as shown in FIG. 14.

Figure 14:
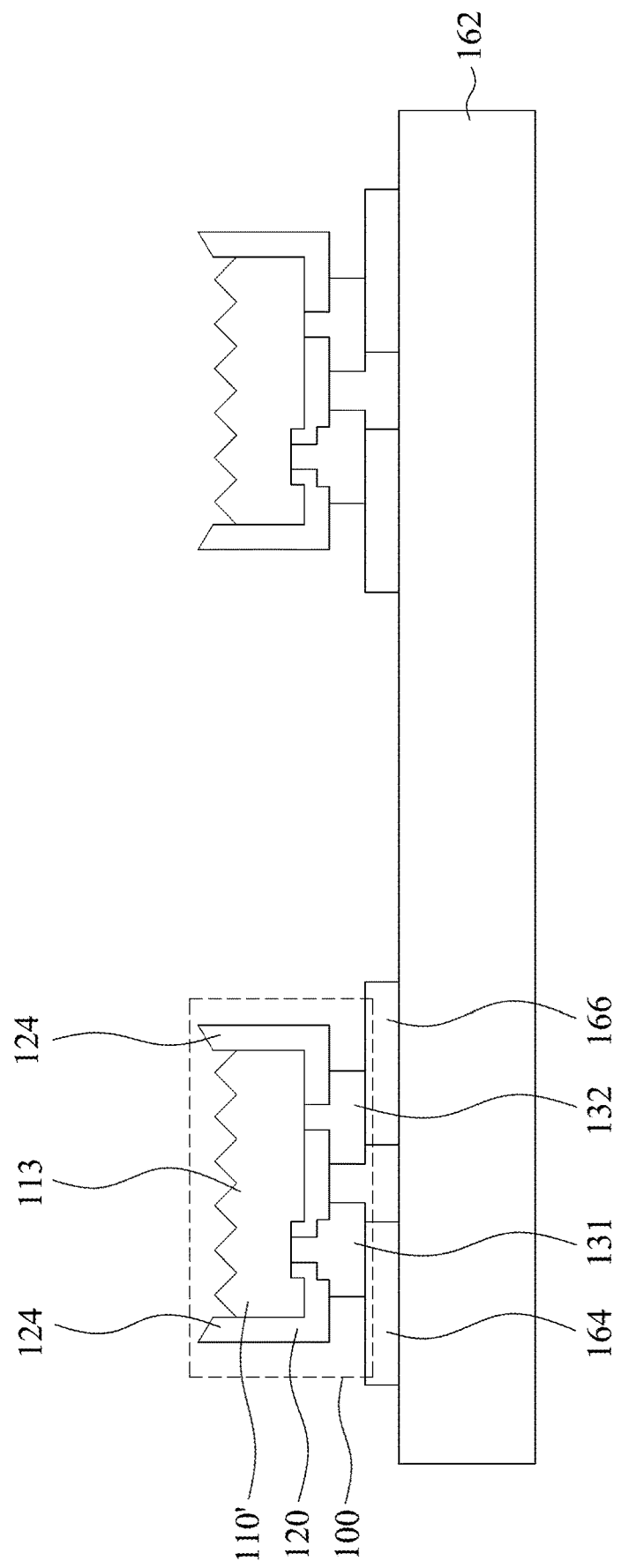
Figure 15:
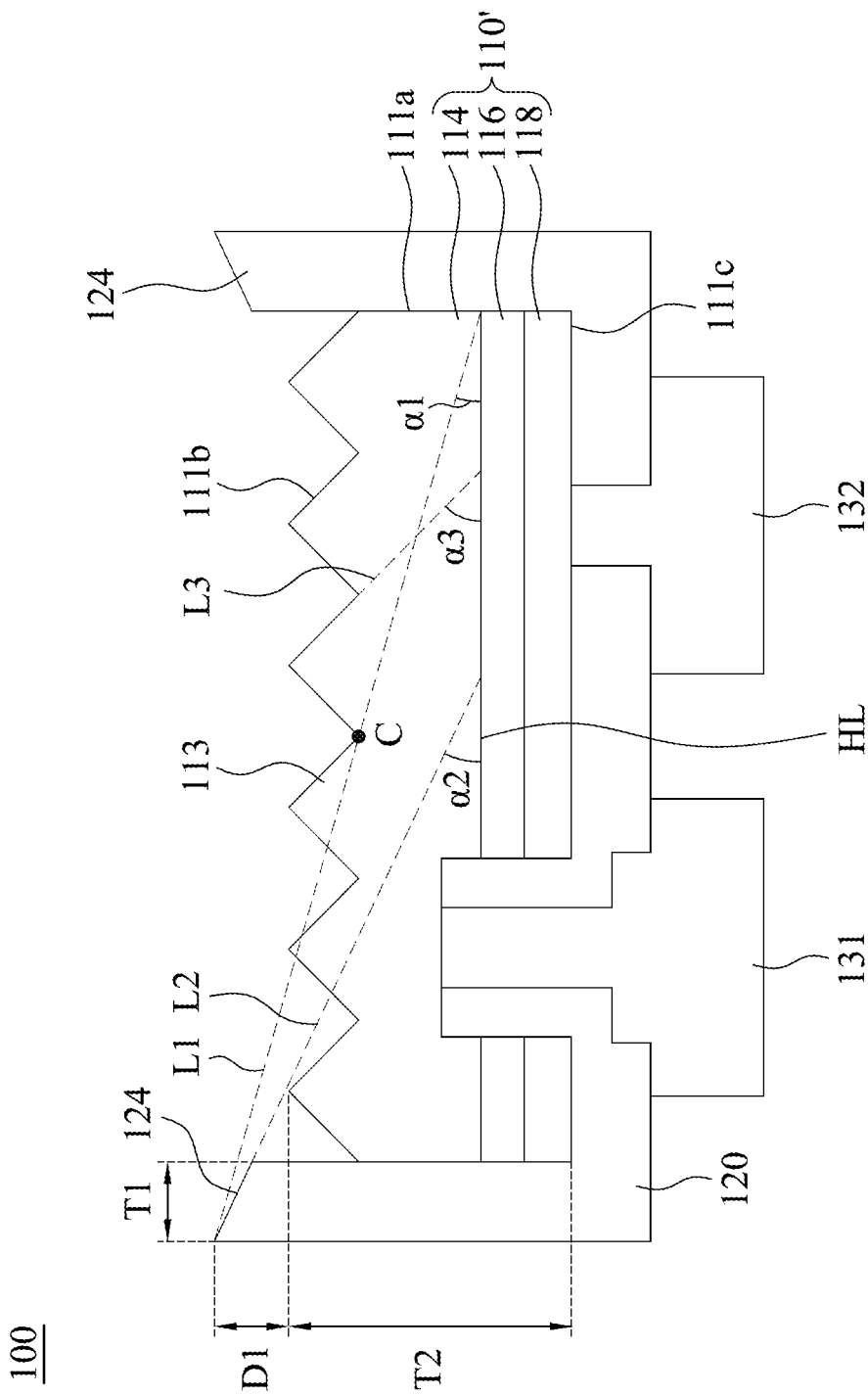
FIG. 15 illustrates an enlarged figure of the light-emitting diode chip in FIG. 14.

FIG. 15 illustrates an enlarged diagram of the light-emitting diode chip 100 in FIG. 14. In FIG. 15, the light-emitting diode chip 100 includes a patterned semiconductor layer 110', an insulating layer 120, a first electrode 131 and a second electrode 132. The patterned semiconductor layer 110' has a sidewall 111a, a top side 111b and a bottom side 111c opposite to the top side 111b. The sidewall 111a connects the top side 111b and the bottom side 111c, and a concave-convex structure 113 is at the top side 111b of the patterned semiconductor layer 110'. The concave-convex structure 113 may be regular or irregular. In some embodiments, the patterned semiconductor layer 110' may be a multilayer structure and includes a first semiconductor layer 114, an active layer 116 and a second semiconductor layer 118 arranged from top to bottom. The first semiconductor layer 114 has a first type semiconductive material, such as n-type, and the second semiconductor layer 118 has a second type semiconductive material different from the first type semiconductive material, such as p-type. The active layer 116 may be a layer added with quantum well structures and/or quantum dot structures; therefore the active layer 116 may emit specific light when current passing through the active layer 116.

The insulating layer 120 covers the sidewall 111a and the bottom side 111c of the patterned semiconductor layer 110'. In some embodiments, the insulating layer 120 may be penetrated by light emitting from the active layer 116 of the patterned semiconductor layer 110' to obtain a light pattern with a large beam angle. In some embodiments, the insulating layer 120 is able to reflect light emitting from the active layer 116 of the patterned semiconductor layer 110' to obtain a light pattern with concentrated top view light. In some embodiments, the insulating layer 120 includes a distributed Bragg reflector (DBR). The insulating layer 120 has a protruding portion 124 extending and protruding above the concave-convex structure 113 along a direction parallel to the sidewall 111a. The light-emitting diode chip 100 with the protruding portion 124 of the insulating layer 120 is easily fixed to the adhesive material 154 shown in FIG. 11 by the protruding portion 124. Further, the presence of the protruding portion 124 of the insulating layer 120 reduces adhesion between the adhesive material 154 and the light-emitting diode chip 100. Hence, when the light-emitting diode chip 100 is transferred to the third carrier 162 (referring to FIG. 13), huge adhesion, which makes the adhesive material 154 damage, stick to, or be not able to detach from the light-emitting diode chip 100, is avoided, thereby yield of transferring the light-emitting diode chip 100 is increased. In some embodiments, a thickness T1 of the insulating layer 120 is in a range from about 0.4 µm to about 3.5 µm. If the thickness of the insulating layer 120 is out of the disclosed range, the protruding portion 124 of the insulating layer 120 is difficult to insert into the adhesive material 154, such that the light-emitting diode chip 100 is difficult to be fixed on the adhesive material 154.

In some embodiments, a vertical distance D1 is between a highest point of the concave-convex structure 113 and a highest point of the protruding portion 124, and the vertical distance D1 is greater than 0.5 µm and is less than four times the thickness T2 of the patterned semiconductor layer 110'. In some other embodiments, the highest point of the protruding portion 124 and a center point C of the concave-convex structure 113 forms a connecting line L1, and the connecting line L1 and a horizontal cross-section HL of the patterned semiconductor layer 110' forms a first angle α1 in a range from 1° to 10°. When the light-emitting diode chip 100 can reflect light emitting from the active layer 116, the beam angle of the light-emitting diode chip 100 is thereby limited in a predetermined range, such as less than 120°. In some embodiments, the horizontal cross-section HL may be the interface between the first semiconductor layer 114 and the active layer 116 or the interface between the second semiconductor layer 118 and the active layer 116.

In some embodiments, an upper surface of the protruding portion 124 tilts to the patterned semiconductor layer 110'. Tilt degree of the upper surface of the protruding portion 124 may be determined based on different situations; for example, when the viscosity of the adhesive material 154 is higher, greater tilt degree may make the protruding portion 124 easier to insert into the adhesive material 154. In some embodiments, an extending line L2 of the upper surface of the protruding portion 124 and the horizontal section HL forms a second angle α2, and an extending line L3 of any surface of the concave-convex structure 113 and the horizontal section HL forms a third angle α3. And the second angle α2 is less than the third angle α3. When the second angle α2 is smaller than the third angle α3 and the protruding portion 124 of the insulating layer 120 may reflect light emitting from the concave-convex structure 113, light of the light-emitting diode chip 100 may concentrate and emit upwards.

The first electrode 131 and the second electrode 132 are at the bottom side 111c of the patterned semiconductor layer 110', and the second electrode 132 is adjacent to the first electrode 131. The first electrode 131 penetrates through the insulating layer 120 and is in contact with the first semiconductor layer 114, and the second electrode 132 penetrates through the insulating layer 120 and is in contact with the second semiconductor layer 118. The first electrode 131 and the second electrode 132 may further electrically connect with the conductive pads 164 and 166 on the third carrier 162 respectively.

Figure 16:
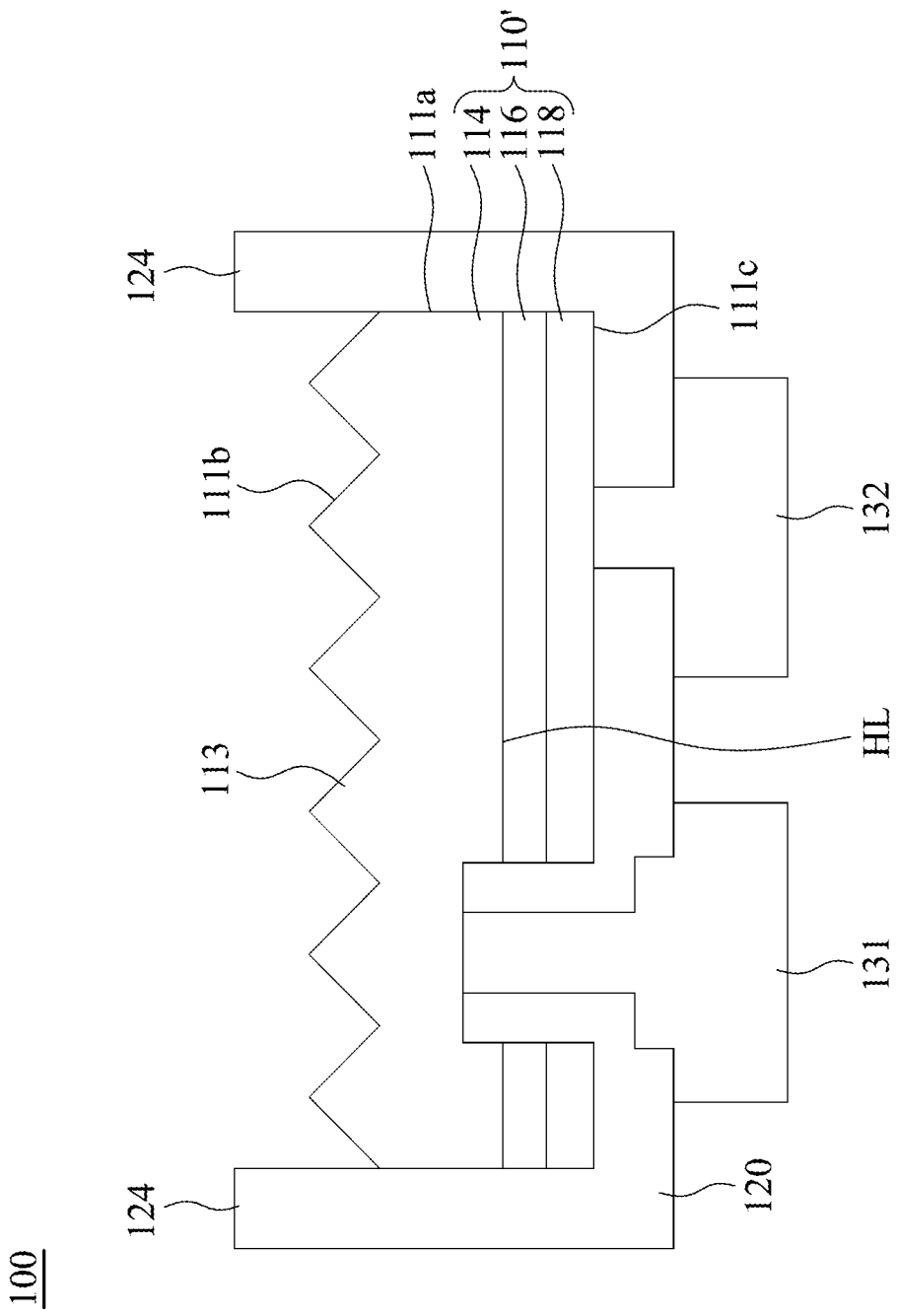
FIG. 16 illustrates a cross-section view of the light-emitting diode chip of some embodiments in accordance with the present disclosure.
Figure 17B:
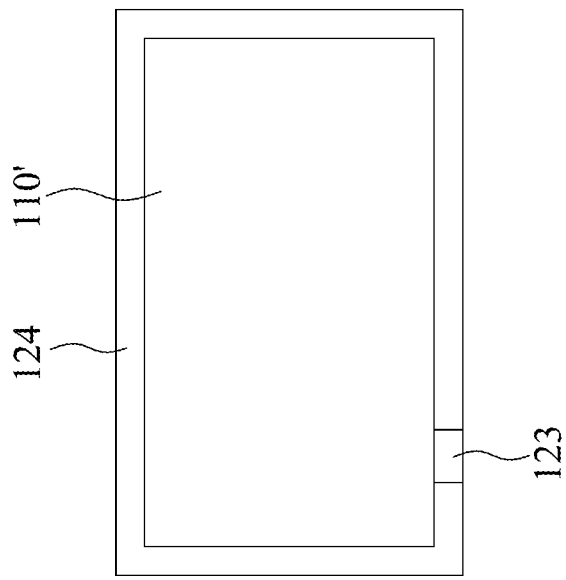
FIGS. 17A, 17B, 18A, and 18B illustrate top views of the light-emitting diode chips of some embodiments in accordance with the present disclosure.
Figure 17A:
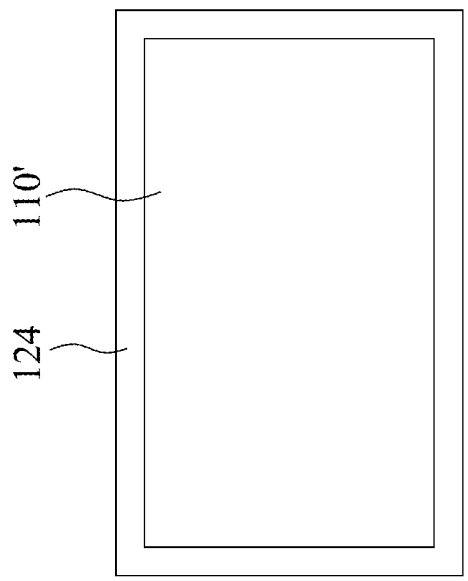

The protruding portion 124 of the insulating layer 120 may have different shapes. For example, the upper surface of the protruding portion 124 may be flat, as shown in FIG. 16, which illustrates the light-emitting diode chip 100 of some embodiments in accordance with the present disclosure. In FIG. 16, the upper surface of the protruding portion 124 may be substantially parallel to the horizontal section HL. Details related to the light-emitting diode chip 100 in FIG. 16 are the same as or similar to details related to the light-emitting diode chip 100 in FIG. 15; therefore detailed descriptions are not described herein.

Figure 18B:
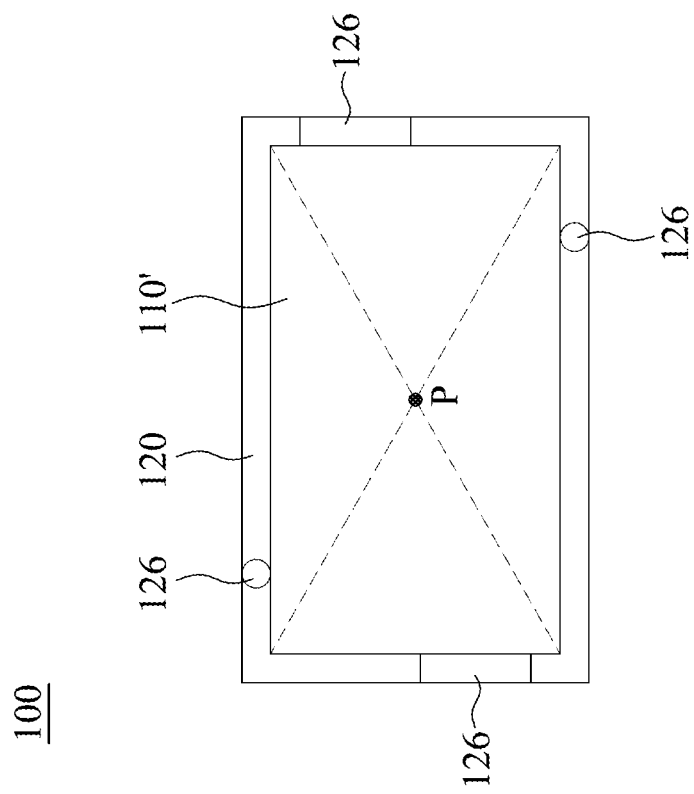
Figure 18A:
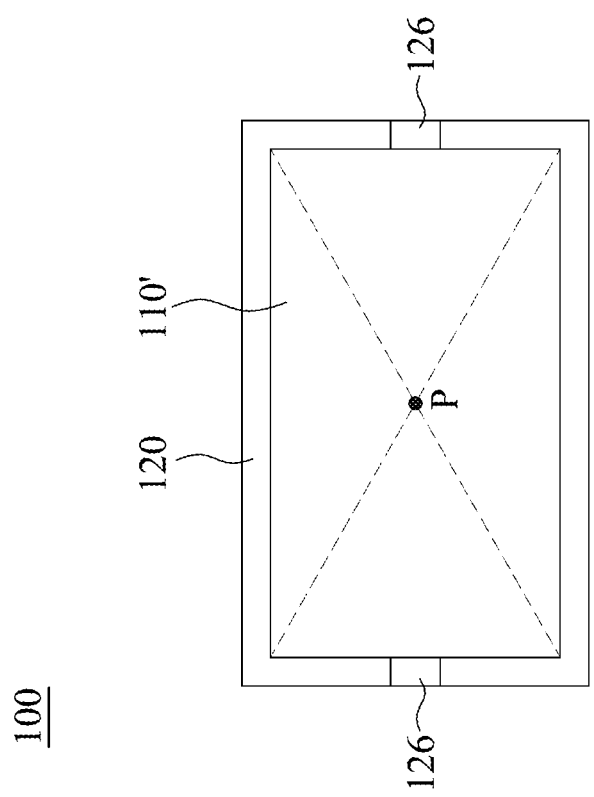

FIGS. 17A-18B illustrate top views of the light-emitting diode chips 100 of some embodiments in accordance with the present disclosure. In some embodiments, the protruding portion 124 of the insulating layer 120 may also have different plan-view patterns. For example, in FIG. 17A, the protruding portion 124 of the insulating layer 120 is a closed ring and is set along a perimeter of the patterned semiconductor layer 110' to surround the patterned semiconductor layer 110'. In FIG. 17B, the protruding portion 124 of the insulating layer 120 is a non-closed ring including at least an opening 123 and is set along the perimeter of the patterned semiconductor layer 110' to surround the patterned semiconductor layer 110'. It is noted that the location of the opening 123 is not limited to the location shown in FIG. 17B. For example, the opening 123 may be at the longer side of the protruding portion 124, as shown in FIG. 17B. The opening 123 may also be at the shorter side of the protruding portion 124. The opening 123 exposes the insulating layer 120 below, i.e. in the opening 123, the bottom of the opening 123 of the insulating layer 120 is leveled with the top side 111b of the patterned semiconductor layer 110'. In some embodiments, the protruding portion 124 of the insulating layer 120 may also include at least a pair of sub-protruding portions 126, as shown in FIGS. 18A and 18B. The sub-protruding portions 126 may have any suitable shapes, such as rectangles (FIG. 18A), circles (FIG. 18B) or other suitable shapes. Each pair of the sub-protruding portions 126 are disposed point-symmetrically about a geometric center P of the patterned semiconductor layer 110' and are set at the perimeter of the patterned semiconductor layer 110'. The size of the sub-protruding portions 126 are large enough to insert into the adhesive material 154 and provide adhesion to the adhesive material 154, and reduce the contact area between the light-emitting diode chip 100 and the adhesive material 154.

FIG. 19 illustrates a cross-section view of the light-emitting diode chip 100 of some embodiments in accordance with the present disclosure. In some embodiments, the concave-convex structure 113 may also include polymer. For example, when the light-emitting diode chip 100 is developed from the structure shown in FIG. 1B, the polymer layer 104 is not entirely removed in the process. In the final structure of the light-emitting diode chip 100, the polymer layer 104 is still on the patterned semiconductor layer 110'. Therefore, the concave-convex structure 113 may also include polymer, as shown in FIG. 19.

As mentioned above, the protruding portion of the insulating layer in the present disclosure can reduce the contact area between the light-emitting diode chip and the adhesive material, thereby reducing adhesion between the light-emitting diode chip and the adhesive material. Therefore, when transferring the light-emitting diode chip, the light-emitting diode chip will not stick on the adhesive material due to huge adhesion, thereby increasing yield of transferring the light-emitting diode chip.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A light-emitting diode chip, comprising:
a semiconductor layer having a sidewall, a top side and a bottom side opposite to the top side, wherein the sidewall connects the top side and the bottom side, and a concave-convex structure is at the top side of the semiconductor layer, the top side comprising a topmost surface;
an insulating layer covering the sidewall and the bottom side of the semiconductor layer, wherein the insulating layer has a protruding portion extending and protruding above the top side of the semiconductor layer along a direction parallel to the sidewall;
a first electrode on the bottom side of the semiconductor layer and penetrating through the insulating layer; and
a second electrode adjacent to the first electrode, wherein the second electrode is on the bottom side of the semiconductor layer and penetrates through the insulating layer;
wherein, the protruding portion and another portion of the insulating layer have the same material;
wherein, the protruding portion of the insulating layer does not cover the topmost surface of the top side of the semiconductor layer.

2. The light-emitting diode chip of claim 1, wherein a thickness of the protruding portion of the insulating layer along a direction perpendicular to the sidewall is in a range from 0.4 μm to 3.5 μm.

3. The light-emitting diode chip of claim 1, wherein the highest point of the protruding portion and a center point of the concave-convex structure forms a connecting line, the connecting line and a horizontal cross-section of the semiconductor layer forms a first angle in a range from about 1° to about 10°.

4. The light-emitting diode chip of claim 1, wherein an upper surface of the protruding portion of the insulating layer is flat.

5. The light-emitting diode chip of claim 1, wherein an upper surface of the protruding portion of the insulating layer tilts to the semiconductor layer.

6. The light-emitting diode chip of claim 5, wherein the upper surface and a horizontal cross-section of the semiconductor layer forms a second angle, a surface of the concave-convex structure and the horizontal cross-section of the semiconductor layer forms a third angle, and the second angle is smaller than the third angle.

7. The light-emitting diode chip of claim 1, wherein the protruding portion is a closed ring and is set along a perimeter of the semiconductor layer to surround the semiconductor layer.

8. The light-emitting diode chip of claim 1, wherein the protruding portion is a non-closed ring comprising at least an opening and is set along a perimeter of the semiconductor layer to surround the semiconductor layer.

9. The light-emitting diode chip of claim 1, wherein the protruding portion comprises at least a pair of sub-protruding portions, the at least a pair of sub-protruding portions are disposed point-symmetrically about a geometric center of the semiconductor layer and at a perimeter of the semiconductor layer.

10. The light-emitting diode chip of claim 1, wherein the insulating layer is able to reflect light emitting from the semiconductor layer.

11. The light-emitting diode chip of claim 1, wherein the insulating layer comprises a distributed Bragg reflector (DBR).

12. The light-emitting diode chip of claim 1, wherein a material of the insulating layer comprises an oxide layer, a nitride layer, or combinations thereof.

13. A light-emitting diode device, comprising:
a carrier; and
a plurality of the light-emitting diode chips of claim 1 arranged on the carrier.

14. The light-emitting diode chip of claim 1, wherein an optional layer is located on the top side of the semiconductor layer.

15. The light-emitting diode chip of claim 14, wherein the optional layer is conformally covering the top side of the semiconductor layer.

16. The light-emitting diode chip of claim 14, wherein the protruding portion protrudes above the optional layer.

17. The light-emitting diode chip of claim 14, wherein the optional layer is connected to the insulating layer.

18. The light-emitting diode chip of claim 1, wherein the protruding portion does not directly contact the semiconductor layer.

19. The light-emitting diode chip of claim 1, wherein the direction that the protruding portion extending and protruding along with is perpendicular to the top side of the semiconductor layer.

20. The light-emitting diode chip of claim 1, wherein the concave-convex structure is connected to the sidewall of the semiconductor layer.

* * * * *